(12) United States Patent
Cok et al.

(10) Patent No.: US 7,531,955 B2
(45) Date of Patent: May 12, 2009

(54) OLED DEVICE WITH IMPROVED EFFICIENCY AND ROBUSTNESS

(75) Inventors: Ronald S. Cok, Rochester, NY (US); Lee W. Tutt, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 577 days.

(21) Appl. No.: 11/179,409

(22) Filed: Jul. 12, 2005

(65) Prior Publication Data

US 2007/0013291 A1  Jan. 18, 2007

(51) Int. Cl.
H05B 33/10 (2006.01)
H01J 33/04 (2006.01)
H01J 1/62 (2006.01)
H05B 33/00 (2006.01)

(52) U.S. Cl. .............. 313/501; 313/504; 313/505; 313/507; 313/512; 445/25

(58) Field of Classification Search ......... 313/501–512; 445/24–25
See application file for complete search history.

(56) References Cited

U.S. PATENT DOCUMENTS

| | | | |
|---|---|---|---|
| 4,476,292 A | 10/1984 | Ham et al. | |
| 4,769,292 A | 9/1988 | Tang et al. | |
| 5,247,190 A | 9/1993 | Friend et al. | |
| 5,834,893 A | 11/1998 | Bulovic et al. | |
| 5,955,837 A | 9/1999 | Horikx et al. | |
| 6,091,195 A | 7/2000 | Forrest et al. | |
| 6,111,355 A | 8/2000 | Inoue et al. | |
| 6,259,204 B1 | 7/2001 | Ebisawa et al. | |
| 6,551,440 B2 | 4/2003 | Tanaka | |
| 6,777,871 B2 | 8/2004 | Duggal et al. | |
| 6,787,796 B2 | 9/2004 | Do et al. | |
| 6,821,828 B2 | 11/2004 | Ichijo et al. | |
| 2001/0026124 A1 | 10/2001 | Liu et al. | |
| 2003/0127973 A1 | 7/2003 | Weaver et al. | |
| 2004/0027327 A1 | 2/2004 | LeCain et al. | |

(Continued)

FOREIGN PATENT DOCUMENTS

EP  1 061 778  12/2000

(Continued)

OTHER PUBLICATIONS

Japanese Patent 11-323196 (machine translation), Kenzo et al. Nov. 1999.*

(Continued)

*Primary Examiner*—Sikha Roy
*Assistant Examiner*—Tracie Y Green
(74) *Attorney, Agent, or Firm*—Andrew J. Anderson; Raymond L. Owens

(57) ABSTRACT

An organic light-emitting diode (OLED) device including a substrate; an OLED formed on the substrate; a transparent cover provided over the OLED through which light from the OLED is emitted; separately formed spacer element particles having a first average size distributed above the OLED, providing spacing between the OLED and the cover, and forming a transparent gap between the OLED and the cover, and separately formed light-scattering element particles distributed over the OLED between the spacer element particles, having a second average size smaller than the first size and for scattering light emitted by the OLED.

17 Claims, 5 Drawing Sheets

U.S. PATENT DOCUMENTS

| | | | |
|---|---|---|---|
| 2004/0056590 A1* | 3/2004 | Lim et al. | 313/506 |
| 2004/0061136 A1 | 4/2004 | Tyan et al. | |
| 2004/0119400 A1* | 6/2004 | Takahashi et al. | 313/504 |
| 2004/0121017 A1* | 6/2004 | Ishii et al. | 424/487 |
| 2004/0217702 A1 | 11/2004 | Garner et al. | |
| 2005/0018431 A1 | 1/2005 | Shiang | |
| 2005/0064780 A1* | 3/2005 | Auch et al. | 445/25 |
| 2005/0212413 A1* | 9/2005 | Matsuura et al. | 313/504 |
| 2006/0192487 A1* | 8/2006 | Choi et al. | 313/512 |
| 2007/0154561 A1* | 7/2007 | Takeda et al. | 424/489 |

FOREIGN PATENT DOCUMENTS

| | | |
|---|---|---|
| EP | 1 100 129 | 5/2001 |
| WO | WO 01/44865 | 6/2001 |
| WO | WO 01/45140 | 6/2001 |
| WO | WO 02/37568 | 5/2002 |
| WO | WO 02/37580 | 5/2002 |

OTHER PUBLICATIONS

Tsutsui T et al. "Doubling Coupling-Out Efficiency In Organic Light-Emitting Devices Using a Thin Silica Aerogen Layer", *Adv. Mater.* 2001, 13, No. 15.

Meerholz K. et al., "Outsmarting Waveguide Losses in Thin-Film Light-Emitting Diodes" *Adv. Funct. Mater.* 2001. 11, No. 4.

"Organic Electroluminescent Diodes"; of C. W. Tang et al; Applied Physics Letter; vol. 51; No. 12; Sep. 21, 1987; pp. 913-915.

"Electroluminescence Of Doped Organic Thin Films"; of C. W. Tang et al; Journal of Applied Physics; vol. 65; No. 9; May 1, 1989; pp. 3610-3616.

"Modification Of Polymer Light Emission By Lateral Microstructure"; of A. N. Safonov et al., Synthetic Metals; 116; 2001; pp. 145-148.

"Brass Scattering From Periodically Microstructures Light Emitting Diodes"; of John M. Lupton et al.; Applied Physics Letters; vol. 77; No. 21; Nov. 20, 2000; pp. 3340-3342.

"Sharply Directed Emission In Organic Electroluminescent Diodes With An Optical-Microcavity Structure"; Tetsuo Tsutsui et al; Applied Physics Letters; vol. 65; No. 15; Oct. 10, 1994; pp. 1868-1870.

\* cited by examiner

OLED DEVICE WITH IMPROVED EFFICIENCY AND ROBUSTNESS

FIELD OF THE INVENTION

The present invention relates to organic light-emitting diode (OLED) devices, and more particularly, to OLED device structures for improving light output, improving robustness, and reducing manufacturing costs.

BACKGROUND OF THE INVENTION

Organic light-emitting diodes (OLEDs) are a promising technology for flat-panel displays and area illumination lamps. The technology relies upon thin-film layers of materials coated upon a substrate and employing a cover affixed to the substrate around the periphery of the OLED device. The thin-film layers of materials can include, for example, organic materials, electrodes, conductors, and silicon electronic components as are known and taught in the OLED art. The cover includes a cavity to avoid contacting the cover to the thin-film layers of materials when the cover is affixed to the substrate.

OLED devices generally can have two formats known as small molecule devices such as disclosed in U.S. Pat. No. 4,476,292 and polymer OLED devices such as disclosed in U.S. Pat. No. 5,247,190. Either type of OLED device may include, in sequence, an anode, an organic EL element, and a cathode. The organic EL element disposed between the anode and the cathode commonly includes an organic hole-transporting layer (HTL), an emissive layer (EML) and an organic electron-transporting layer (ETL). Holes and electrons recombine and emit light in the EML layer. Tang et al. (Appl. Phys. Lett., 51, 913 (1987), Journal of Applied Physics, 65, 3610 (1989), and U.S. Pat. No. 4,769,292) demonstrated highly efficient OLEDs using such a layer structure. Since then, numerous OLEDs with alternative layer structures, including polymeric materials, have been disclosed and device performance has been improved.

Light is generated in an OLED device when electrons and holes that are injected from the cathode and anode, respectively, flow through the electron transport layer and the hole transport layer and recombine in the emissive layer. Many factors determine the efficiency of this light generating process. For example, the selection of anode and cathode materials can determine how efficiently the electrons and holes are injected into the device; the selection of ETL and HTL can determine how efficiently the electrons and holes are transported in the device, and the selection of EML can determine how efficiently the electrons and holes be recombined and result in the emission of light, etc. It has been found, however, that one of the key factors that limits the efficiency of OLED devices is the inefficiency in extracting the photons generated by the electron-hole recombination out of the OLED devices. Due to the high optical indices of the organic materials used, most of the photons generated by the recombination process are actually trapped in the devices due to total internal reflection. These trapped photons never leave the OLED devices and make no contribution to the light output from these devices.

A typical OLED device uses a glass substrate, a transparent conducting anode such as indium-tin-oxide (ITO), a stack of organic layers, and a reflective cathode layer. Light generated from the device is emitted through the glass substrate. This is commonly referred to as a bottom-emitting device. Alternatively, a device can include a substrate, a reflective anode, a stack of organic layers, and a top transparent cathode layer. Light generated from the device is emitted through the top transparent electrode. This is commonly referred to as a top-emitting device. In these typical devices, the index of the ITO layer, the organic layers, and the glass is about 2.0, 1.7, and 1.5 respectively. It has been estimated that nearly 60% of the generated light is trapped by internal reflection in the ITO/organic EL element, 20% is trapped in the glass substrate, and only about 20% of the generated light is actually emitted from the device and performs useful functions.

Referring to FIG. 2, an OLED device as taught in the prior art includes a substrate 10 on which are formed thin-film electronic components 20, for example conductors, thin-film transistors, and capacitors in an active-matrix device or conductors in a passive-matrix device. The thin-film electronic components 20 can cover a portion of the substrate 10 or the entire substrate 10, depending on the OLED device design. Over the substrate 10 are formed one or more first electrode(s) 14. One or more layers of organic materials 16 are formed over the first electrode(s) 14, at least one layer of which is light emitting. One or more second electrode(s) 18 are formed over the layers of organic materials 16. A cover 12 with a cavity forming a gap 32 to avoid contacting the thin-film layers 14, 16, 18, 20 is affixed to the substrate 10. In some designs, it is proposed to fill the gap 32 with a curable polymer or resin material to provide additional rigidity. The second electrode(s) 18 may be continuous over the surface of the OLED. Upon the application of a voltage across the first and second electrodes 14 and 18 provided by the thin-film electronic components 20, a current can flow through the organic material layers 16 to cause one of the organic layers to emit light 50a through the cover 12 (if it, any material in the gap 32, and the second electrode 18 are transparent) or to emit light 50b through the substrate 10 (if it and the first electrode 14 are transparent). If light is emitted through the substrate 10 it is a bottom-emitter OLED and the thin-film electronic components 20 may occlude some of the light 50b emitted or may limit the emission area to the area 26 between the thin-film electronic components 20, thereby reducing the aperture ratio of the OLED device. If light is emitted through the cover 12 the OLED device is a top-emitter and the thin-film electronic components 20. The arrangement used in FIG. 2 is typically a bottom emitter configuration with a thick, highly conductive, reflective electrode 18 and suffers from a reduced aperture ratio. Referring to FIG. 3, a top-emitter configuration can locate a first electrode 14 partially over the thin-film electronic components 20 thereby increasing the amount of light-emitting area 26. Since, in this top-emitter case, the first electrode 14 does not transmit light, it can be thick, opaque, and highly conductive. However, the second electrode must then be transparent.

In commercial practice, the substrate and cover have comprised 0.7 mm thick glass, for example as employed in the Eastman Kodak Company LS633 digital camera. For relatively small devices, for example less than five inches in diagonal, the use of a cavity in a cover 12 is an effective means of providing relatively rigid protection to the thin-film layers of materials 16. However, for very large devices, the substrate 10 or cover 12, even when composed of rigid materials like glass and employing materials in the gap 32, can bend slightly and cause the inside of the cover 12 or gap materials to contact or press upon the thin-film layers of materials 16, possibly damaging them and reducing the utility of the OLED device.

It is known to employ spacer elements to separate thin sheets of materials. For example, U.S. Pat. No. 6,259,204 B1 entitled "Organic electroluminescent device" describes the use of spacers to control the height of a sealing sheet above a substrate. Such an application does not, however, provide protection to thin-film layers of materials in an OLED device.

US20040027327 A1 entitled "Components and methods for use in electro-optic displays" published Feb. 12, 2004 describes the use of spacer beads introduced between a backplane and a front plane laminate to prevent extrusion of a sealing material when laminating the backplane to the front plane of a flexible display. However, in this design, any thin-film layers of materials are not protected when the cover is stressed. Moreover, the sealing material will reduce the transparency of the device and requires additional manufacturing steps.

U.S. Pat. No. 6,821,828 B2 entitled "Method of manufacturing a semiconductor device" granted Nov. 23, 2004 describes an organic resin film such as an acrylic resin film patterned to form columnar spacers in desired positions in order to keep two substrates apart. The gap between the substrates is filled with liquid crystal materials. The columnar spacers may be replaced by spherical spacers sprayed onto the entire surface of the substrate. However, columnar spacers are formed lithographically and require complex processing steps and expensive materials. Moreover, this design is applied to liquid crystal devices and does not provide protection to thin-film structures deposited on a substrate.

U.S. Pat. No. 6,551,440 B2 entitled "Method of manufacturing color electroluminescent display apparatus and method of bonding light-transmitting substrates" granted Apr. 22, 2003. In this invention, a spacer of a predetermined grain diameter is interposed between substrates to maintain a predetermined distance between the substrates. When a sealing resin deposited between the substrates spreads, surface tension draws the substrates together. The substrates are prevented from being in absolute contact by interposing the spacer between the substrates, so that the resin can smoothly be spread between the substrates. This design does not provide protection to thin-film structures deposited on a substrate.

The use of cured resins is also optically problematic for top-emitting OLED devices. As is well known, a significant portion of the light emitted by an OLED may be trapped in the OLED layers, substrate, or cover. By filling the gap with a resin or polymer material, this problem may be exacerbated. Referring to FIG. 6, a prior-art bottom-emitting OLED has a transparent substrate 10, a transparent first electrode 14, one or more layers 16 of organic material, one of which is light-emitting, a reflective second electrode 18, a gap 32 and an encapsulating cover 12. The encapsulating cover 12 may be opaque and may be coated directly over the second electrode 18 so that no gap 32 exists. When a gap 32 does exist, it may be filled with polymer or desiccants to add rigidity and reduce water vapor permeation into the device. Light emitted from one of the organic material layers 16 can be emitted directly out of the device, through the substrate 10, as illustrated with light ray 1. Light may also be emitted and internally guided in the substrate 10 and organic layers 16, as illustrated with light ray 2. Alternatively, light may be emitted and internally guided in the layers 16 of organic material, as illustrated with light ray 3. Light rays 4 emitted toward the reflective second electrode 18 are reflected by the reflective second electrode 18 toward the substrate 10 and then follow one of the light ray paths 1, 2, or 3.

A variety of techniques have been proposed to improve the out-coupling of light from thin-film light emitting devices. For example, diffraction gratings have been proposed to control the attributes of light emission from thin polymer films by inducing Bragg scattering of light that is guided laterally through the emissive layers; see "Modification of polymer light emission by lateral microstructure" by Safonov et al., Synthetic Metals 116, 2001, pp. 145-148, and "Bragg scattering from periodically microstructured light emitting diodes" by Lupton et al., Applied Physics Letters, Vol. 77, No. 21, Nov. 20, 2000, pp. 3340-3342. Brightness enhancement films having diffractive properties and surface and volume diffusers are described in WO0237568 A1 entitled "Brightness and Contrast Enhancement of Direct View Emissive Displays" by Chou et al., published May 10, 2002. The use of micro-cavity techniques is also known; for example, see "Sharply directed emission in organic electroluminescent diodes with an optical-microcavity structure" by Tsutsui et al., Applied Physics Letters 65, No. 15, Oct. 10, 1994, pp. 1868-1870. However, none of these approaches cause all, or nearly all, of the light produced to be emitted from the device. Moreover, such diffractive techniques cause a significant frequency dependence on the angle of emission so that the color of the light emitted from the device changes with the viewer's perspective.

Reflective structures surrounding a light-emitting area or pixel are referenced in U.S. Pat. No. 5,834,893 issued Nov. 10, 1998 to Bulovic et al. and describe the use of angled or slanted reflective walls at the edge of each pixel. Similarly, Forrest et al. describe pixels with slanted walls in U.S. Pat. No. 6,091,195 issued Jul. 18, 2000. These approaches use reflectors located at the edges of the light emitting areas. However, considerable light is still lost through absorption of the light as it travels laterally through the layers parallel to the substrate within a single pixel or light emitting area.

Scattering techniques are also known. Chou (International Publication Number WO 02/37580 A1) and Liu et al. (U.S. Patent Application Publication No. 2001/0026124 A1) taught the use of a volume or surface scattering layer to improve light extraction. The scattering layer is applied next to the organic layers or on the outside surface of the glass substrate and has an optical index that matches these layers. Light emitted from the OLED device at higher than the critical angle that would have otherwise been trapped can penetrate into the scattering layer and be scattered out of the device. The efficiency of the OLED device is thereby improved but still has deficiencies as explained below.

U.S. Pat. No. 6,787,796 entitled "Organic electroluminescent display device and method of manufacturing the same" by Do et al issued Sep. 7, 2004 describes an organic electroluminescent (EL) display device and a method of manufacturing the same. The organic EL device includes a substrate layer, a first electrode layer formed on the substrate layer, an organic layer formed on the first electrode layer, and a second electrode layer formed on the organic layer, wherein a light loss preventing layer having different refractive index areas is formed between layers of the organic EL device having a large difference in refractive index among the respective layers. U.S. Patent Application Publication No. 2004/0217702 entitled "Light extracting designs for organic light emitting diodes" by Garner et al., similarly discloses use of microstructures to provide internal refractive index variations or internal or surface physical variations that function to perturb the propagation of internal waveguide modes within an OLED. When employed in a top-emitter embodiment, the use of an index-matched polymer adjacent the encapsulating cover is disclosed.

However, scattering techniques, by themselves, cause light to pass through the light-absorbing material layers multiple times where they are absorbed and converted to heat. Moreover, trapped light may propagate a considerable distance horizontally through the cover, substrate, or organic layers before being scattered out of the device, thereby reducing the sharpness of the device in pixellated applications such as displays. For example, as illustrated in FIG. 7, a prior-art pixellated bottom-emitting OLED device may include a plurality of independently controlled pixels 60, 62, 64, 66, and 68 and a scattering element 21, typically formed in a layer, located between the transparent first electrode 12 and the substrate 10. A light ray 5 emitted from the light-emitting layer may be scattered multiple times by light scattering element 21, while traveling through the substrate 10, organic layer(s) 16, and transparent first electrode 14 before it is emitted from the device. When the light ray 5 is finally emitted from the device, the light ray 5 has traveled a considerable distance through the various device layers from the original pixel 60 location where it originated to a remote pixel 68 where it is emitted, thus reducing sharpness. Most of the lateral travel occurs in the substrate 10, because that is by far the thickest layer in the package. Also, the amount of light emitted is reduced due to absorption of light in the various layers. If the light scattering layer is alternatively placed adjacent to a transparent encapsulating cover of a top-emitting device as illustrated in FIG. 8, the light may similarly travel a significant distance in the encapsulating cover 12 before being emitted.

Light-scattering layers used externally to an OLED device are described in U.S. Patent Application Publication No. 2005/0018431 entitled "Organic electroluminescent devices having improved light extraction" by Shiang and U.S. Pat. No. 5,955,837 entitled "System with an active layer of a medium having light-scattering properties for flat-panel display devices" by Horikx, et al. These disclosures describe and define properties of scattering layers located on a substrate in detail. Likewise, U.S. Pat. No. 6,777,871 entitled "Organic ElectroLuminescent Devices with Enhanced Light Extraction" by Duggal et al., describes the use of an output coupler comprising a composite layer having specific refractive indices and scattering properties. While useful for extracting light, this approach will only extract light that propagates in the substrate (illustrated with light ray 2) and will not extract light that propagates through the organic layers and electrodes (illustrated with light ray 3). Moreover, if applied to display devices, this structure will decrease the perceived sharpness of the display. Referring to FIG. 9, the sharpness of an active-matrix OLED device employing a light-scattering layer coated on the substrate is illustrated. The average MTF (sharpness) of the device (in both horizontal and vertical directions) is plotted for an OLED device with the light-scattering layer and without the light scattering layer. As is shown, the device with the light-scattering layer is much less sharp than the device without the light scattering layer, although more light was extracted (not shown) from the OLED device with the light-scattering layer.

U.S. Patent Application Publication No. 2004/0061136 entitled "Organic light emitting device having enhanced light extraction efficiency" by Tyan et al., describes an enhanced light extraction OLED device that includes a light scattering layer. In certain embodiments, a low-index isolation layer (having an optical index substantially lower than that of the organic electroluminescent element) is employed adjacent to a reflective layer in combination with the light scattering layer to prevent low angle light from striking the reflective layer, and thereby minimize absorption losses due to multiple reflections from the reflective layer. The particular arrangements, however, may still result in reduced sharpness of the device.

There is a need therefore for an improved OLED device structure that that avoids the problems noted above and improves the robustness and performance of the device and reduces manufacturing costs.

SUMMARY OF THE INVENTION

In accordance with one embodiment, the invention is directed towards an organic light-emitting diode (OLED) device, comprising: a substrate; an OLED formed on the substrate comprising a first electrode formed over the substrate, one or more layers of organic material, one of which emits light, formed over the first electrode, and a transparent second electrode formed over the one or more layers of organic material, the transparent second electrode and layer(s) of organic light-emitting material having a first refractive index range; a transparent cover provided over the OLED through which light from the OLED is emitted, the cover having a second refractive index; separately formed spacer element particles having a first average size distributed above the transparent second electrode, providing spacing between the transparent second electrode and the cover, and forming a transparent gap between the transparent second electrode and the cover, the transparent gap having a third refractive index lower than each of the first refractive index range and second refractive index; and separately formed light-scattering element particles distributed over the second electrode between the spacer element particles, having a second average size smaller than the first size and for scattering light emitted by the light-emitting layer.

ADVANTAGES

The present invention has the advantage that it improves the robustness and performance of an OLED device and reduces manufacturing costs.

It will be understood that the figures are not to scale since the individual layers are too thin and the thickness differences of various layers too great to permit depiction to scale.

DETAILED DESCRIPTION OF THE INVENTION

Figure 1:
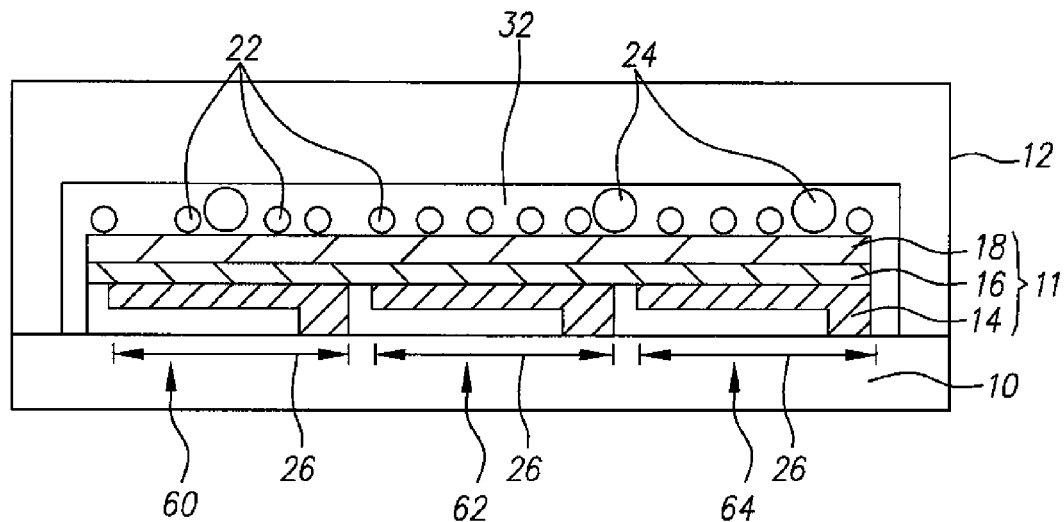
FIG. 1 is a cross section of a top-emitter OLED device having spacer element particles according to one embodiment of the present invention.
Figure 2:
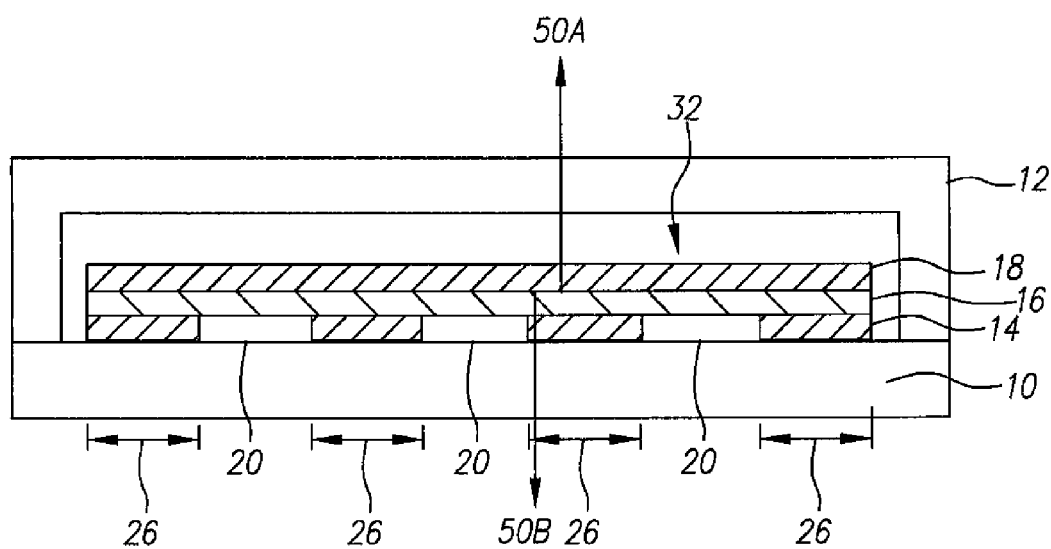
FIG. 2 is a cross section of a prior-art OLED device.
Figure 3:
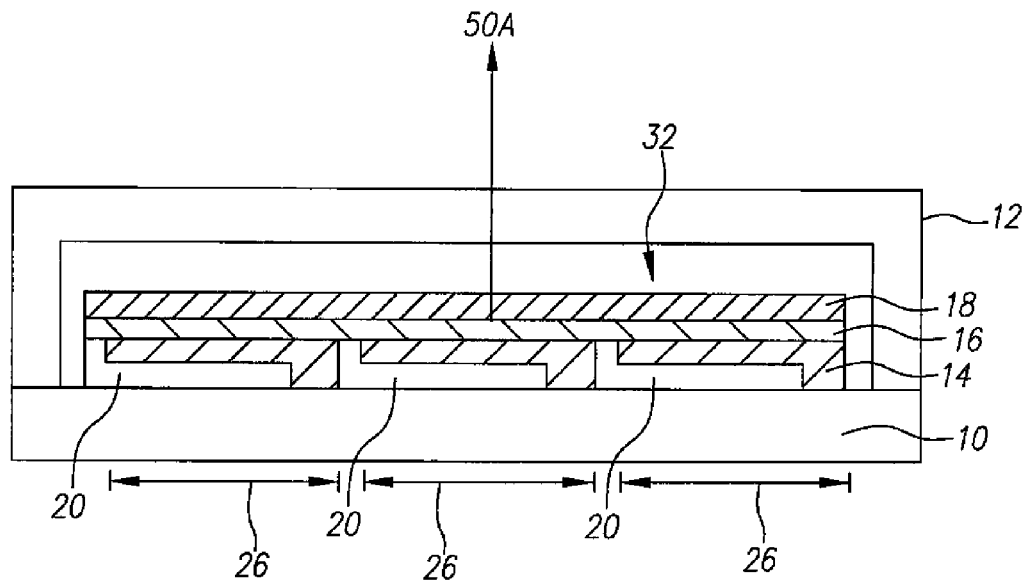
FIG. 3 is a cross section of an alternative prior-art OLED device.

Referring to FIG. 1, in accordance with the present invention an organic light-emitting diode (OLED) device comprises a substrate 10; an OLED 11 formed on the substrate 10 comprising a first electrode 14 formed over the substrate, one or more layers of organic material 16, one of which is light emitting, formed over the first electrode 14, and a transparent second electrode 18 formed over the one or more layers of organic material 16, the transparent second electrode and layer(s) of organic light-emitting material having a first refractive index range; a transparent cover 12 provided over the OLED 11 through which light from the OLED is emitted, the cover having a second refractive index; separately formed spacer element particles 24 having a first average size distributed above the transparent second electrode 18, providing spacing between the transparent second electrode 18 and the cover 12, and forming a transparent gap 32 between the transparent second electrode and the cover, the transparent gap having a third refractive index lower than each of the first refractive index range and second refractive index; and separately formed light-scattering element particles 22 distributed over the second electrode 18 between the spacer element particles, having a second average size smaller than the first size and for scattering light emitted by the light-emitting layer.

As employed herein, light scattering particles are optical particles that tend to randomly redirect any light that impinges on a layer of such particles from any direction. As used herein, a transparent electrode is one that passes some light and includes electrodes that are semi-transparent, partially reflective, or partially absorptive. Similarly as taught in, commonly assigned U.S. Ser. No. 11/065,082 filed Feb. 24, 2005, the disclosure of which is hereby incorporated in its entirety by reference, the transparent electrode and layer(s) of organic light-emitting material have a first refractive index range, the transparent cover has a second refractive index, and a light scattering element is located between the substrate and cover. The transparent gap has a third refractive index lower than each of the first refractive index range and second refractive index.

In preferred embodiments, the encapsulating cover 12 and substrate 10 may comprise glass or plastic with typical refractive indices of between 1.4 and 1.6. The transparent gap 32 may comprise a solid layer of optically transparent material, a void, or a gap. Voids or gaps may be a vacuum or filled with an optically transparent gas or liquid material. For example air, nitrogen, helium, or argon all have a refractive index of between 1.0 and 1.1 and may be employed. Lower index solids which may be employed include fluorocarbon or MgF, each having indices less than 1.4. Any gas employed is preferably inert. First electrode 14 is preferably made of metal (for example aluminum, silver, or magnesium) or metal alloys. Transparent second electrode 18 is preferably made of transparent conductive materials, for example indium tin oxide (ITO) or other metal oxides. The organic material layers 16 may comprise organic materials known in the art, for example, hole-injection, hole-transport, light-emitting, electron-injection, and/or electron-transport layers. Such organic material layers are well known in the OLED art. The organic material layers typically have a refractive index of between 1.6 and 1.9, while indium tin oxide has a refractive index of approximately 1.8-2.1. Hence, the various layers 18 and 16 in the OLED have a refractive index range of 1.6 to 2.1. Of course, the refractive indices of various materials may be dependent on the wavelength of light passing through them, so the refractive index values cited here for these materials are only approximate. In any case, the transparent low-index gap preferably has a refractive index at least 0.1 lower than that of each of the first refractive index range and the second refractive index at the desired wavelength for the OLED emitter.

According to the present invention, the first and second sizes refer to average sizes of the spacer element particles 24 and the light-scattering element particles 22. In a preferred embodiment, the second size average is preferably less than 2 microns, more preferably between 100 nm and 2 microns, and most preferably between 500 nm and 2 microns. The first size is preferably from 1 to 100 microns, more preferably from 2 to 10 microns. In general, it is further preferred that the first size be at least one micron larger than the second size. Moreover, according to the present invention, the light-scattering element particles 22 have a size optimized to scatter visible light emitted by the light-emitting layer and the spacer element particles 24 have a size optimized to prevent the cover 12 from contacting the OLED 11 or light-scattering element particles 22 when the substrate 10 or cover 12 are stressed, for example by bending. It is not essential that all of the spacer element particles have the same shape or size.

Scattering element particles 22 may be employed in a volume scattering layer or a surface scattering layer. In certain embodiments, e.g., scattering element particles 22 may e employed in a layer having at least two different refractive indices. Such a layer may comprise, e.g., a matrix of lower refractive index and scattering element particles with a higher refractive index. Alternatively, the matrix may have a higher refractive index and the scattering element particles may have a lower refractive index. For example, the matrix may comprise silicon dioxide or cross-linked resin having indices of approximately 1.5, or silicon nitride with a much higher index of refraction.

According to the present invention, the spacer element particles 24 and the light-scattering element particles 22 are non-integral with the cover 12 or substrate 10 and are separately formed before they are applied between the cover 12 and the OLED 11 in the gap 32, that is the spacer element particles 24 and the light-scattering element particles 22 are not formed, for example, by lithographic or evaporative materials processes used to make the OLED material 11, electrodes 14 and 18, or thin-film silicon components as are found in active-matrix display devices. As employed in the present invention, the spacer element particles 24 and the light-scattering element particles 22 are separately formed and located in the gap 32 after the cover 12 is formed and the OLED 11 is formed on the substrate 10. The spacer element particles 24 are particles of material, not continuous films, used to either absorb mechanical stress applied between the cover 12 and the substrate 10 or to redirect the applied stress to areas of the OLED device that are not as sensitive or easily damaged. In particular, the spacer element particles 24 are not lithographically formed from materials used to construct or process layers on the substrate 10, for example thin-film electronic components, passivation layers, and electrodes made of various forms of silicon (LTPS, amorphous), silicon dioxide or silicon nitride, and metals or metal oxides, or metal alloys. Likewise, the light-scattering element particles 22 may be diffusive particles, rather than a continuous film but may be formed in a layer. Both the spacer element particles 24 and the light-scattering element particles 22 may be deposited in a matrix material, for example a polymer.

The spacer element particles 24 may be rigid or flexible, and may take a variety of shapes, for example spheres, cylinders, or have a random shape, but it is understood that the shapes are not limited thereto. Spherical shapes may have advantages in deposition, while cylinders may have optical advantages and random shapes may provide useful optical diffusion. In order to effectively space the OLED 11 from the cover 12 and provide a useful optical structure as discussed in U.S. Ser. No. 11/065,082 referred to above, the spacer element particles 24 preferably have a radius or form a layer thickness of at least one micron. The spacer element particles 24 may comprise metals, metal alloys, metal oxides, for example including titanium, for example titanium dioxide, indium tin oxide, or indium zinc oxide, or be formed from a variety of polymers, including electrically conductive polymers. In order to effectively scatter visible light as discussed in U.S. Ser. No. 11/065,082 referred to above, the light-scattering element particles 22 preferably have a radius or form a layer thickness greater than 0.1 microns.

The spacer element particles 24 and light-scattering element particles 22 may be formed of the same material or of different materials. They may both be deposited on the OLED 11 in a common deposition step or, alternatively, the spacer element particles may be deposited on the inside of the cover 12. For example, the spacer element particles 24 may be applied to either the cover 12 or the OLED 11 before the cover 12 is located on the OLED 11 and after the OLED 11 is formed on the substrate 10. Once the cover 12 is formed and the OLED with all of its layers deposited on the substrate, together with any electronic components, the spacer element particles 24 and light-scattering element particles 22 may be deposited on the OLED and the cover brought into proximal alignment with the OLED and attached with a seal. Alternatively, the light-scattering element particles 22 may be deposited on the OLED 11 and the spacer element particles 24 may be distributed over the inside of the cover 12 and then the spacer element particles 24 and the cover 12 brought into proximal alignment with the OLED 11 and substrate 10 and attached with a seal. Embodiments wherein spacer element particles 24 and light-scattering element particles 22 are deposited on the OLED 11 in a common deposition step from a common dispersion may be employed to advantageously reduce manufacturing costs.

The spacer element particles 24 may be located over the OLED 11 or cover 12 in a variety of ways. The spacer element particles 24 themselves may have an adhesive coating and they may be sprayed over the surface of the OLED 11 or cover 12. Likewise, the light-scattering element particles 22 may be located over the OLED 11 in a variety of ways. The light-scattering element particles 22 themselves may have an adhesive coating and they may be sprayed over the surface of the OLED 11. Alternatively, an adhesive may be coated on the OLED 11 or cover 12 and the light-scattering element particles 22 or spacer element particles 24 sprayed or otherwise deposited over the adhesive coating. In such a process, the element particles 22 and/or 24 are typically deposited either in a regular pattern or randomly over the coated surface but a large-scale uniform distribution of spacer element particles 24 is preferred while a smaller-scale uniform distribution of light-scattering element particles 22 is preferred. When distributed over the light-emitting area 26 of an OLED device, the spacer element particles 24 are preferably as transparent as possible to avoid absorbing any emitted light.

In one embodiment, the spacer element particles 24 may be located around the periphery of any light-emitting areas 26 while the light-scattering element particles 22 are located over the light-emitting areas 26. In these locations, any pressure applied by the deformation of the cover 12 or substrate 10 is transmitted to the spacer element particles 24 at the periphery of the light-emitting areas 26, thereby reducing the stress on the light-emitting materials. Although light-emitting materials may be coated over the entire OLED device, stressing or damaging them between the light-emitting areas (without creating an electrical short) may not have a deleterious effect on the OLED device. If, for example, the top electrode 18 is locally damaged, there may not be any significant damage to the device or any change in light emission from the light-emitting areas. Moreover, in a top-emitter configuration, the periphery of the OLED light-emitting areas may be taken up by thin-film silicon materials that are more resistant to stress.

Figure 4:
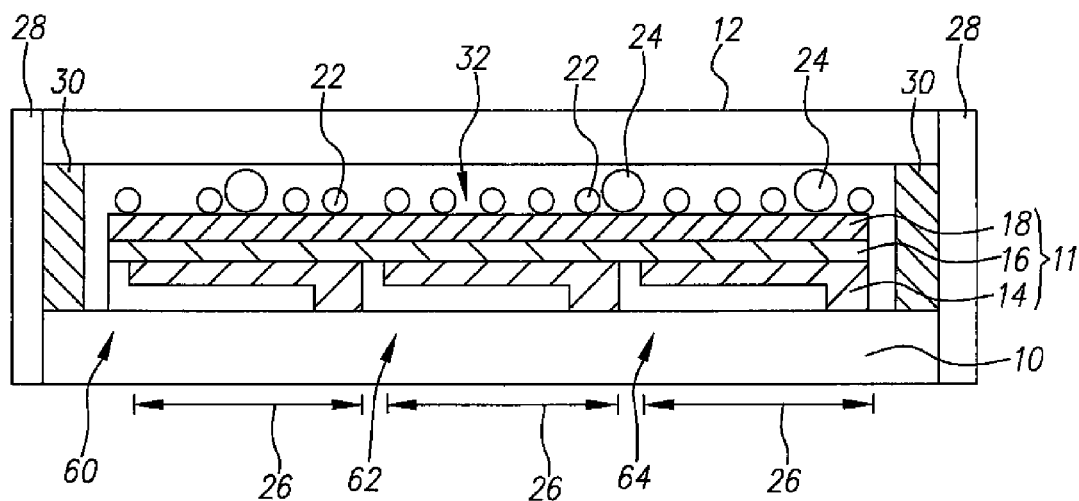
FIG. 4 is a cross section of a top-emitter OLED device having spacer element particles according to an alternative embodiment of the present invention.

The cover 12 may or may not have a cavity. If the cover does have a cavity, the cavity may be deep enough to contain the spacer element particles 24 so that the periphery of the cover may be affixed to the substrate, as shown in FIG. 1. The spacer element particles 24 may be in contact with only the inside of the cover 12 (if applied to the cover) or be in contact with only the OLED 11 (if applied to the OLED), or to both the OLED 1 and the inside of the cover 12. If the spacer element particles 24 are in contact with both the OLED 11 and the inside of the cover 12 and the cover 12 is affixed to the substrate 10, the cavity in the cover 12 should have a depth approximately equal to the combined thickness of the spacer element particles 24 and the OLED 11. Alternatively, referring to FIG. 4, the cover may not have a cavity. In this case, a sealant 30 should be employed to defeat the ingress of moisture into the OLED device. An additional end-cap 28 may be affixed to the edges of the cover 12 and substrate 10 to further defeat the ingress of moisture or other environmental contaminants into the OLED device.

According to the present invention, an OLED device employing light-scattering element particles 22 over the light-emitting areas 26 and spacer element particles 24 located between a cover 12 and an OLED 11 in a gap, emits more light and is more robust in the presence of stress between the cover 12 and the substrate 10. In a typical situation, the cover 12 is deformed either by bending the entire OLED device or by separately deforming the cover 12 or substrate 10, for example by pushing on the cover 12 or substrate 10 with a finger or hand or by striking the cover 12 or substrate 10 with an implement such as a ball. When this occurs, the substrate 12 or cover 10 will deform slightly, putting pressure on the spacer element particles 24. Since the spacer element particles 24 are thicker than the light-scattering element particles 22, the spacer element particles 24 will preferably absorb the pressure, preventing the cover or material within the gap 32 from pressing upon the OLED 11 or the light-scattering element particles 22 and destroying the function of the OLED 11 or the light-scattering element particles 22. The use of spacer element particles 24 that are compressible may also be advantageous in that, under compression, the spacer element particles 24 may increase the surface area in contact with the OLED layers 11 and thereby decrease the pressure applied to the layers.

An additional protective layer may be applied to the top electrode 18 to provide environmental and mechanical protection, e.g., barrier layers such as $SiO_x$ (x>1), Teflon, and alternating inorganic/polymeric layers, including parylene, are known in the art. For example, a plurality of layers of $Al_2O_3$ may be coated over the electrode 18 to provide a hermetic seal and may also provide useful optical properties to the electrode 18.

If coated over the light-emitting areas, the spacer element particles 24 may also scatter light as do the light-scattering element particles 22. Such light scattering by both element particles may have advantages in extracting light from the OLED by reducing the amount of light that is waveguided in the organic layers 16 and electrodes 18 and 14, if they are partially transparent. To enhance the scattering and light extraction effect, the spacer element particles 24 and the light-scattering element particles 22 may have a refractive index greater than the refractive index of any component of the OLED, and the gap 32 has a refractive index lower than the refractive index of any component of the OLED.

Materials of the light-scattering element particles 22 and the spacer element particles 24 can include organic materials (for example polymers or electrically conductive polymers) or inorganic materials. The organic materials may include, e.g., one or more of polythiophene, PEDOT, PET, or PEN. The inorganic materials may include, e.g., one or more of $SiO_x$ (x>1), $SiN_x$ (x>1), $Si_3N_4$, $TiO_2$, MgO, ZnO, $Al_2O_3$, $SnO_2$, $In_2O_3$, $MgF_2$, $Al_2O_3$ and $CaF_2$.

Spacer element particles 24 and light-scattering element particles 22 may be coated as a dispersion in a liquid, for example polymer having a dispersion of titanium dioxide. The element particles may be deposited using a variety of known techniques, for example they may be sprayed on, deposited using inkjet techniques, or spin- or curtain-coated. The element particles may be deposited directly onto an OLED stack, for example onto an electrode, or may be deposited on a protective layer formed on an OLED, for example over a coating of parylene or aluminum oxide formed over an OLED electrode.

Figure 5:
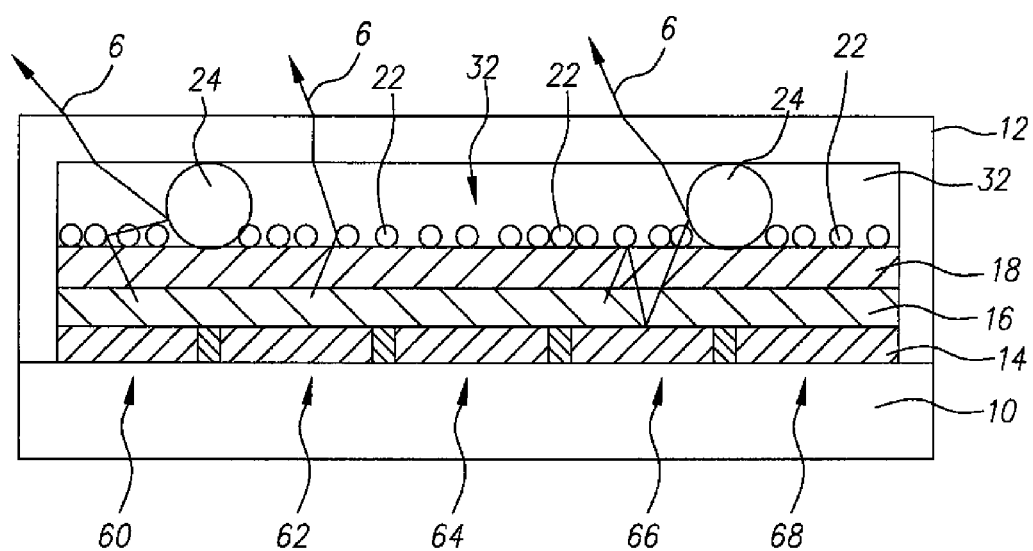
FIG. 5 is a cross section of a top-emitter OLED device according to another alternative embodiment of the present invention.
Figure 6:
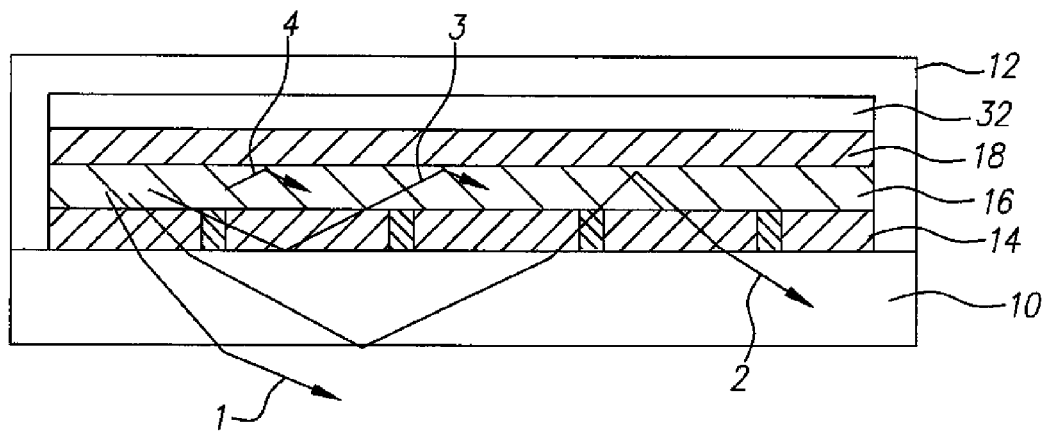
FIG. 6 is a cross section of a prior-art bottom-emitting OLED device illustrating light emission.
Figure 7:
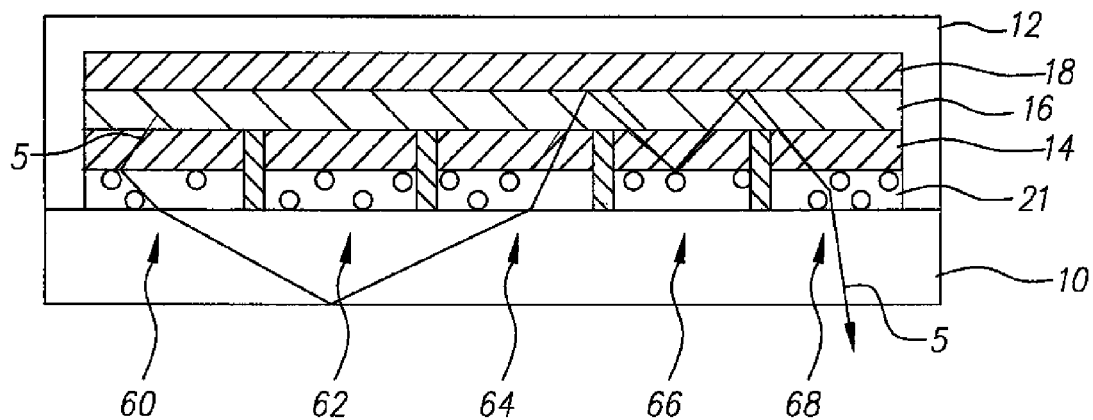
FIG. 7 is a cross section of a bottom-emitting OLED device having a scattering layer as described in the prior-art illustrating light emission.
Figure 8:
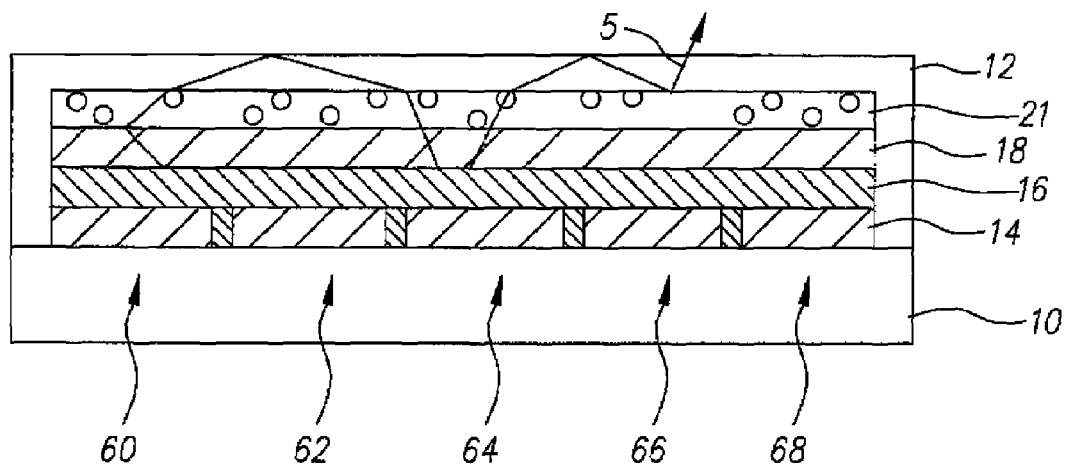
FIG. 8 is a cross section of a top-emitter OLED device having a scattering layer as suggested by the prior-art illustrating light emission.
Figure 9:
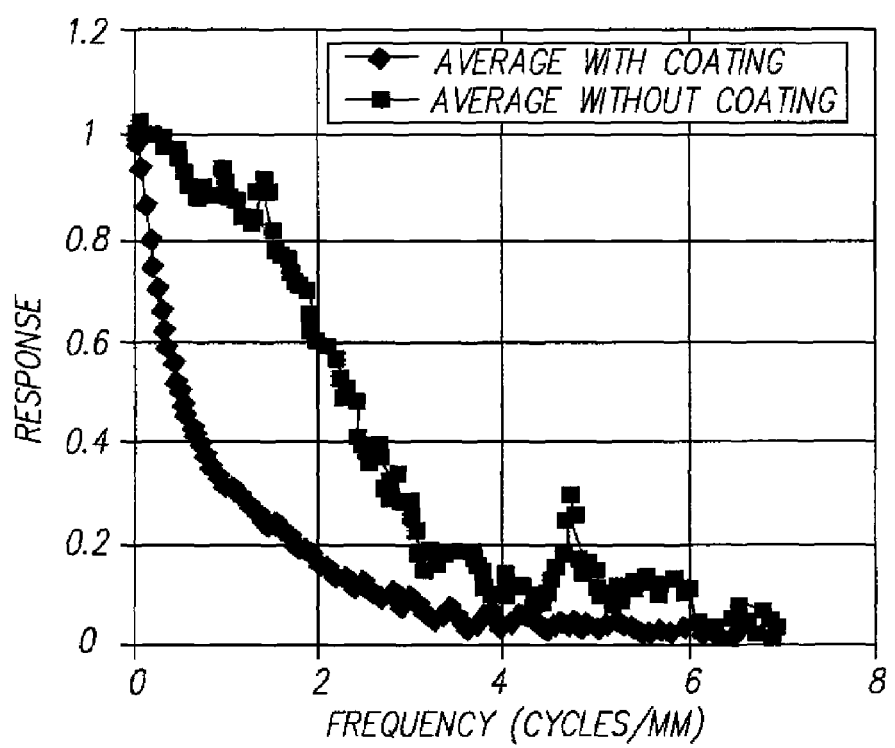
FIG. 9 is a graph illustrating the sharpness of a prior-art OLED display with and without a scattering layer.

The present invention is preferred over the prior art because the number of interlayer reflections that the light encounters and the distance that scattered light travels in the encapsulating cover 12 are reduced. Referring to FIG. 5, after light rays 6 are scattered into an angle that allows it to escape from the organic layers 16 and transparent second electrode 18, it enters the transparent gap 32 (for example, air) having a lower index of refraction than both the transparent electrode 18 and the encapsulating cover 12. Therefore, when the scattered light encounters the encapsulating cover 12, it will pass through the encapsulating cover 12 and be re-emitted on the other side, since light passing from a low-index medium into a higher-index medium cannot experience total internal reflection. Hence, the light will not experience the losses due to repeated transmission through the encapsulating cover 12 or demonstrate the lack of sharpness that results from light being emitted from the organic layers 16 at one point and emitted from the encapsulating cover 12 at a distant point, as illustrated in FIGS. 7 and 8. To facilitate this effect, the transparent relatively low-index gap should not scatter light, and should be as transparent as possible. The transparent gap preferably is at least one micron thick to ensure that emitted light properly propagates there through, and is transmitted through the encapsulating cover 12. FIG. 5 also illustrates locating spacer element particles 24 between light-emitting areas of the device.

Most OLED devices are sensitive to moisture or oxygen, or both, so they are commonly sealed in an inert atmosphere such as nitrogen or argon, along with a moisture-absorbing desiccant such as alumina, bauxite, calcium sulfate, clays, silica gel, zeolites, barium oxide, alkaline metal oxides, alkaline earth metal oxides, sulfates, or metal halides and perchlorates. The spacer element particles 24 and light-scattering element particles 22 may have desiccating properties and may include one or more desiccant materials.

OLED devices of this invention can employ various well-known optical effects in order to enhance their properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The present invention may also be practiced with either active- or passive-matrix OLED devices. It may also be employed in display devices or in area illumination devices. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

The invention has been described in detail with particular reference to certain preferred embodiments thereof, but it will be understood that variations and modifications can be effected within the spirit and scope of the invention.

PARTS LIST 1,3,4,5,6 light rays
10 substrate
11 OLED
12 cover
14 electrode
16 organic layers
18 electrode
20 thin-film electronic components
22 light-scattering element particles
24 spacer element particles
26 light-emitting area
28 end cap
30 sealant
32 gap
50a, 50b light
60, 62, 64, 66, 68 pixels

The invention claimed is:

1. An organic light-emitting diode (OLED) device, comprising:
a substrate;
an OLED formed on the substrate comprising a first electrode formed over the substrate, one or more layers of organic material, one of which emits light, formed over the first electrode, and a transparent second electrode formed over the one or more layers of organic material, the transparent second electrode and layer(s) of organic light-emitting material having a first refractive index range, wherein one of the first or second electrodes is patterned to form a plurality of separated light-emissive areas;
a transparent cover provided over the OLED through which light from the OLED is emitted, the cover having a second refractive index;
separately formed transparent spacer element particles having a first average size distributed above the transparent second electrode in one or more of the separated light-emissive areas, providing spacing between the transparent second electrode and the cover, and forming a transparent gap between the transparent second electrode and the cover, the transparent gap having a third refractive index lower than each of the first refractive index range and second refractive index; and separately formed transparent light-scattering element particles distributed over, and in contact with, the transparent second electrode between the spacer element particles, having a second average size smaller than the first size and for scattering light emitted by the light-emitting layer.

2. The OLED device of claim 1, wherein the spacer element particles are deposited on the cover or the OLED.

3. The OLED device of claim 1, wherein the spacer element particles are in contact with the cover or the OLED or with both the cover and the OLED.

4. The OLED device of claim 1, wherein the spacer element particles are randomly located over the OLED, regularly distributed over the OLED, or are located between light-emitting portions of the OLED.

5. The OLED device of claim 1, wherein the spacer element particles comprise titanium dioxide, polymer, or barium oxide.

6. The OLED device of claim 1, wherein the spacer element particles are light-scattering particles.

7. The OLED device of claim 1, wherein the spacer element particles are affixed to the cover or OLED with an adhesive.

8. The OLED device of claim 7, wherein the adhesive is patterned.

9. The OLED device of claim 1, wherein the gap is filled with a low-index material.

10. The OLED device of claim 1, wherein the gap is filled with an inert gas, air, nitrogen, or argon.

11. The OLED device of claim 1, wherein the spacer element particles have an average particle size greater than 2 microns.

12. The OLED device of claim 1, wherein the light-scattering element particles have an average particle size less than 2 microns.

13. The OLED device of claim 1, wherein the light-scattering element particles have a refractive index greater than the refractive index of any component of the OLED.

14. The OLED device of claim 1, wherein the light-scattering element particles and the spacer element particles comprise the same material.

15. The OLED device of claim 1, wherein the light-scattering element particles and the spacer element particles comprise different materials.

16. The OLED device of claim 1, wherein the light-scattering element particles and the spacer element particles are deposited in a common step.

17. The OLED device of claim 1, wherein the light-scattering element particles are deposited within a matrix material.

* * * * *